United States Patent
Lee

(10) Patent No.: US 7,808,010 B2
(45) Date of Patent: Oct. 5, 2010

(54) NITRIDE SEMICONDUCTOR LIGHT EMITTING DEVICE AND FABRICATION METHOD THEREOF

(75) Inventor: Suk Hun Lee, Gwangjoo-si (KR)

(73) Assignee: LG Innotek Co., Ltd., Seoul (KR)

( * ) Notice: Subject to any disclaimer, the term of this patent is extended or adjusted under 35 U.S.C. 154(b) by 722 days.

(21) Appl. No.: 11/661,185

(22) PCT Filed: Aug. 19, 2005

(86) PCT No.: PCT/KR2005/002756

§ 371 (c)(1),
(2), (4) Date: Feb. 26, 2007

(87) PCT Pub. No.: WO2006/022497

PCT Pub. Date: Mar. 2, 2006

(65) Prior Publication Data

US 2008/0093610 A1    Apr. 24, 2008

(30) Foreign Application Priority Data

Aug. 26, 2004    (KR) .................. 10-2004-0067494

(51) Int. Cl.
H01L 33/00    (2010.01)
H01L 29/06    (2010.01)

(52) U.S. Cl. .............. 257/89; 257/13; 257/79; 257/80; 257/94; 257/97; 257/194; 257/E21.108; 257/E33.005; 257/E33.008; 257/E33.025

(58) Field of Classification Search .......... 257/13, 257/79, 80, 89, 94, 97, 194, E21.108, E33.005, 257/E33.008, E33.025

See application file for complete search history.

(56) References Cited

U.S. PATENT DOCUMENTS

| | | | |
|---|---|---|---|
| 6,623,998 B2 * | 9/2003 | Shibata et al. | 438/22 |
| 6,657,234 B1 | 12/2003 | Tanizawa | |
| 6,965,126 B2 * | 11/2005 | Taki | 257/89 |
| 7,042,017 B2 * | 5/2006 | Yamada | 257/97 |
| 2003/0006418 A1 | 1/2003 | Emerson et al. | |

(Continued)

FOREIGN PATENT DOCUMENTS

JP    10-51070 A    2/1998

(Continued)

*Primary Examiner*—Dao H Nguyen
(74) *Attorney, Agent, or Firm*—Birch, Stewart, Kolasch & Birch, LLP

(57) ABSTRACT

A nitride semiconductor light emitting device comprises a first nitride semiconductor layer, an active layer of a single or multiple quantum well structure formed on the first nitride semiconductor layer and including an InGaN well layer and a multilayer barrier layer, and a second nitride semiconductor layer formed on the active layer. A fabrication method of a nitride semiconductor light emitting device comprises: forming a buffer layer on a substrate, forming a GaN layer on the buffer layer, forming a first electrode layer on the GaN layer, forming an $In_xGa_{1-x}N$ layer on the first electrode layer, forming on the first $In_xGa_{1-x}N$ layer an active layer including an InGaN well layer and a multilayer barrier layer for emitting light, forming a p-GaN layer on the active layer, and forming a second electrode layer on the p-GaN layer.

27 Claims, 5 Drawing Sheets

U.S. PATENT DOCUMENTS

2004/0159851 A1   8/2004   Edmond et al.
2005/0191778 A1   9/2005   Ohtsuka et al.
2005/0230688 A1   10/2005  Lee

FOREIGN PATENT DOCUMENTS

| JP | 2000-286451 A | 10/2000 |
| JP | 2000-349337 A | 12/2000 |
| JP | 2002-33513 A | 1/2002 |
| WO | WO-2004/051707 A2 | 6/2004 |

* cited by examiner

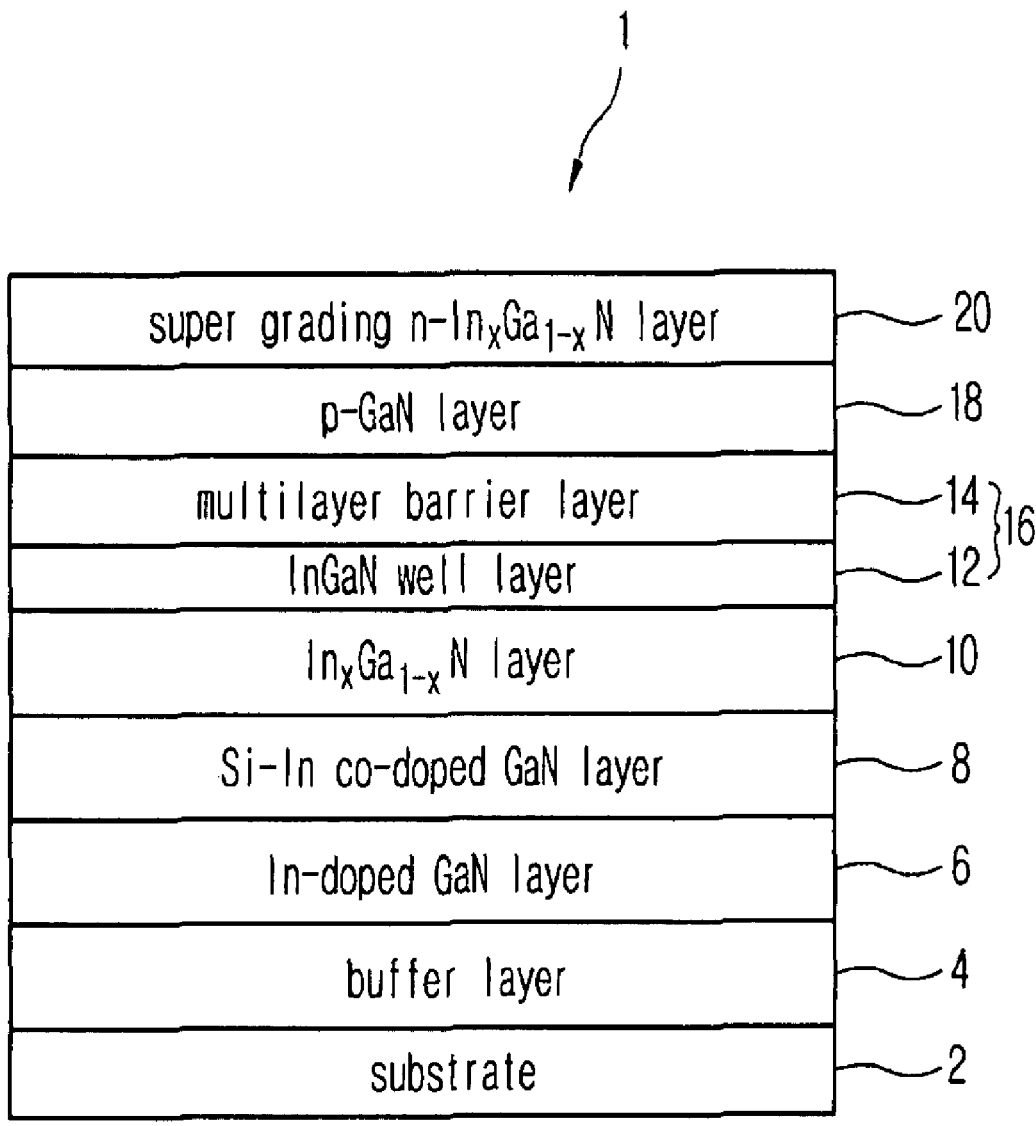
[Fig. 1]
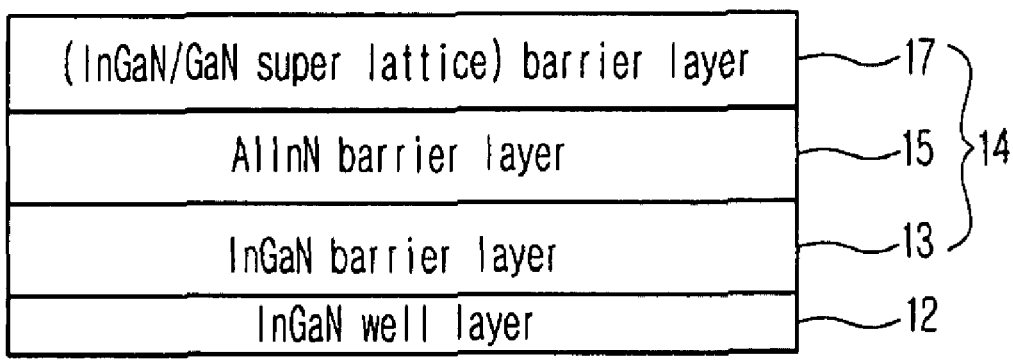
[Fig. 2]

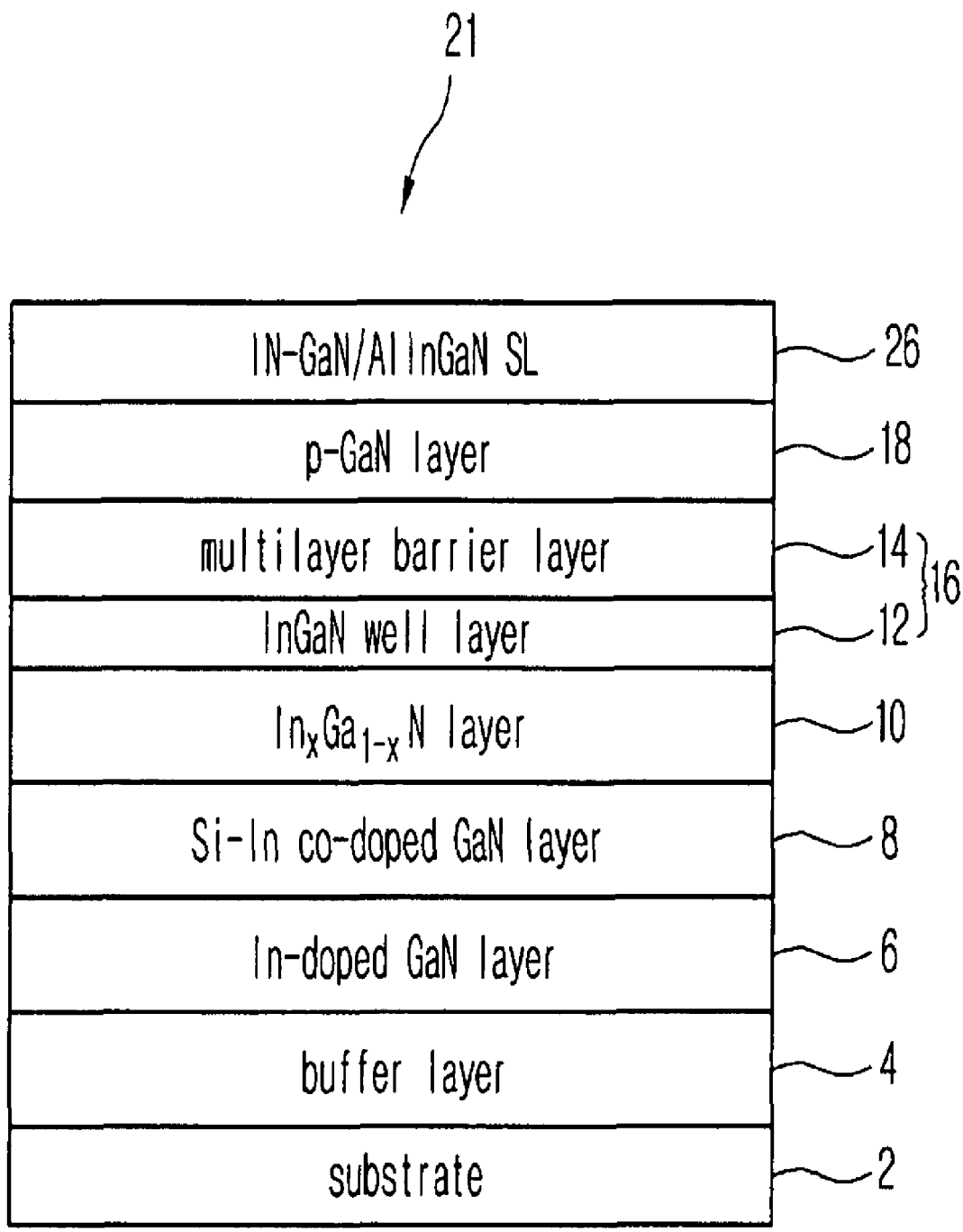
[Fig. 3]

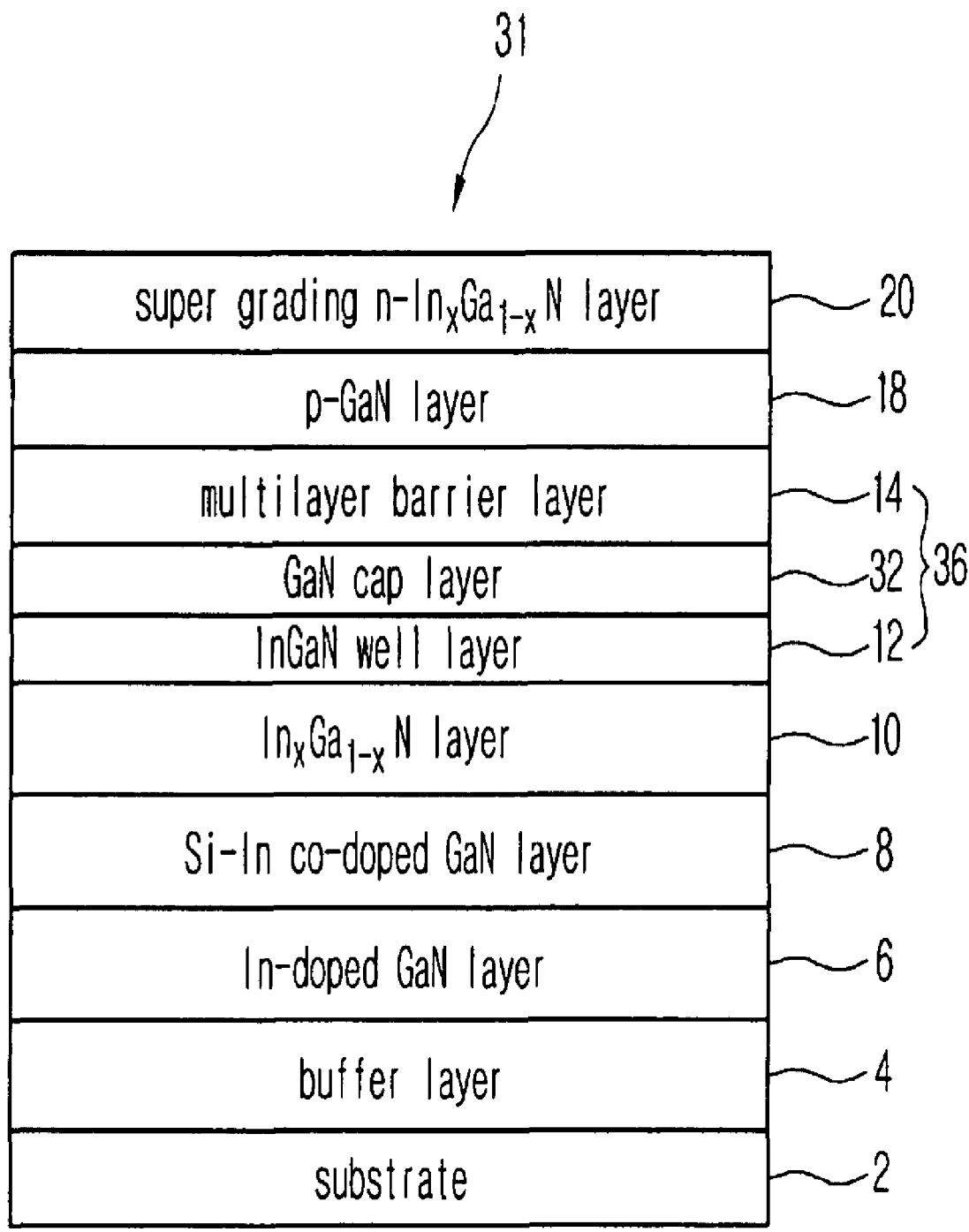
[Fig. 4]

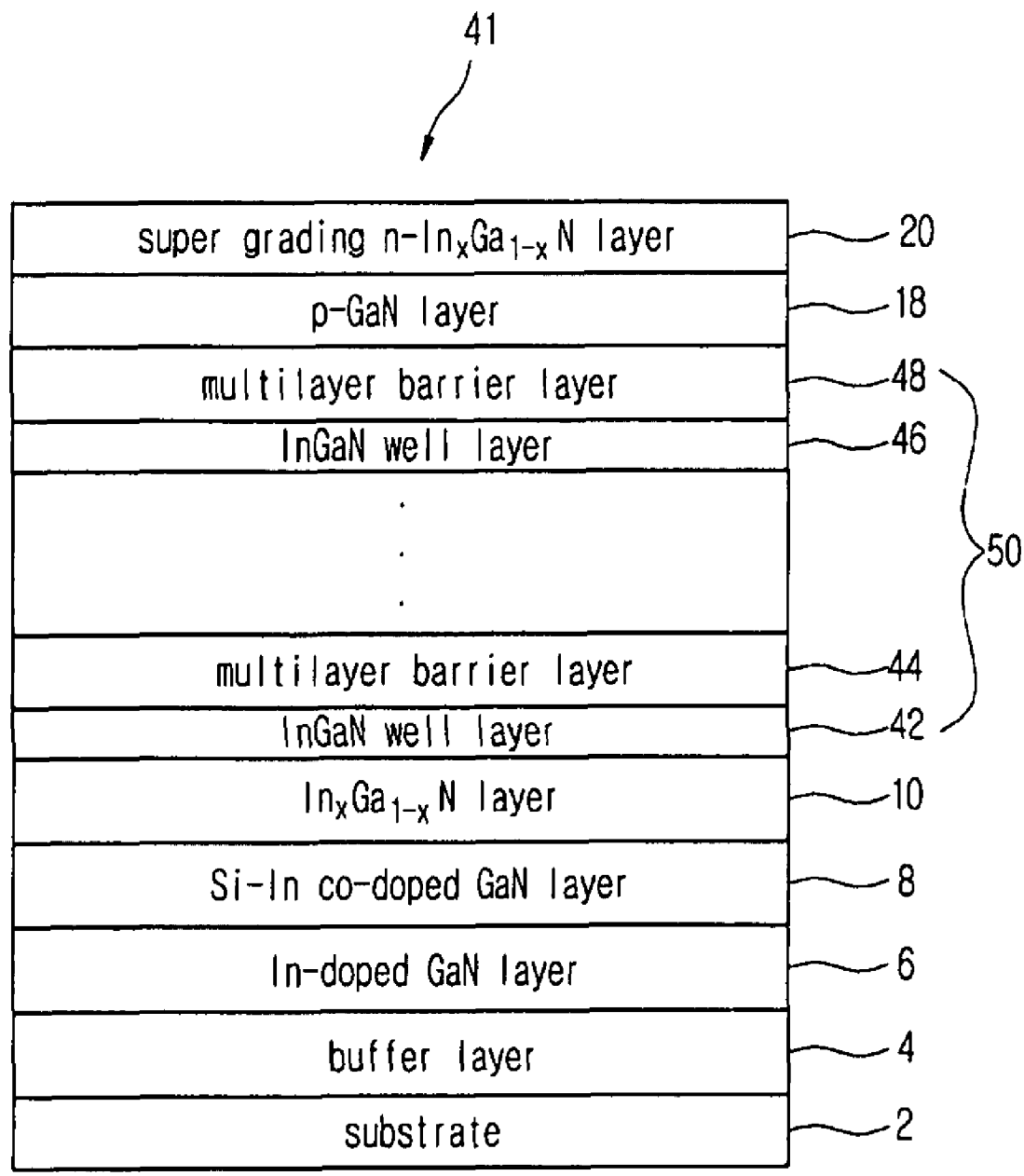

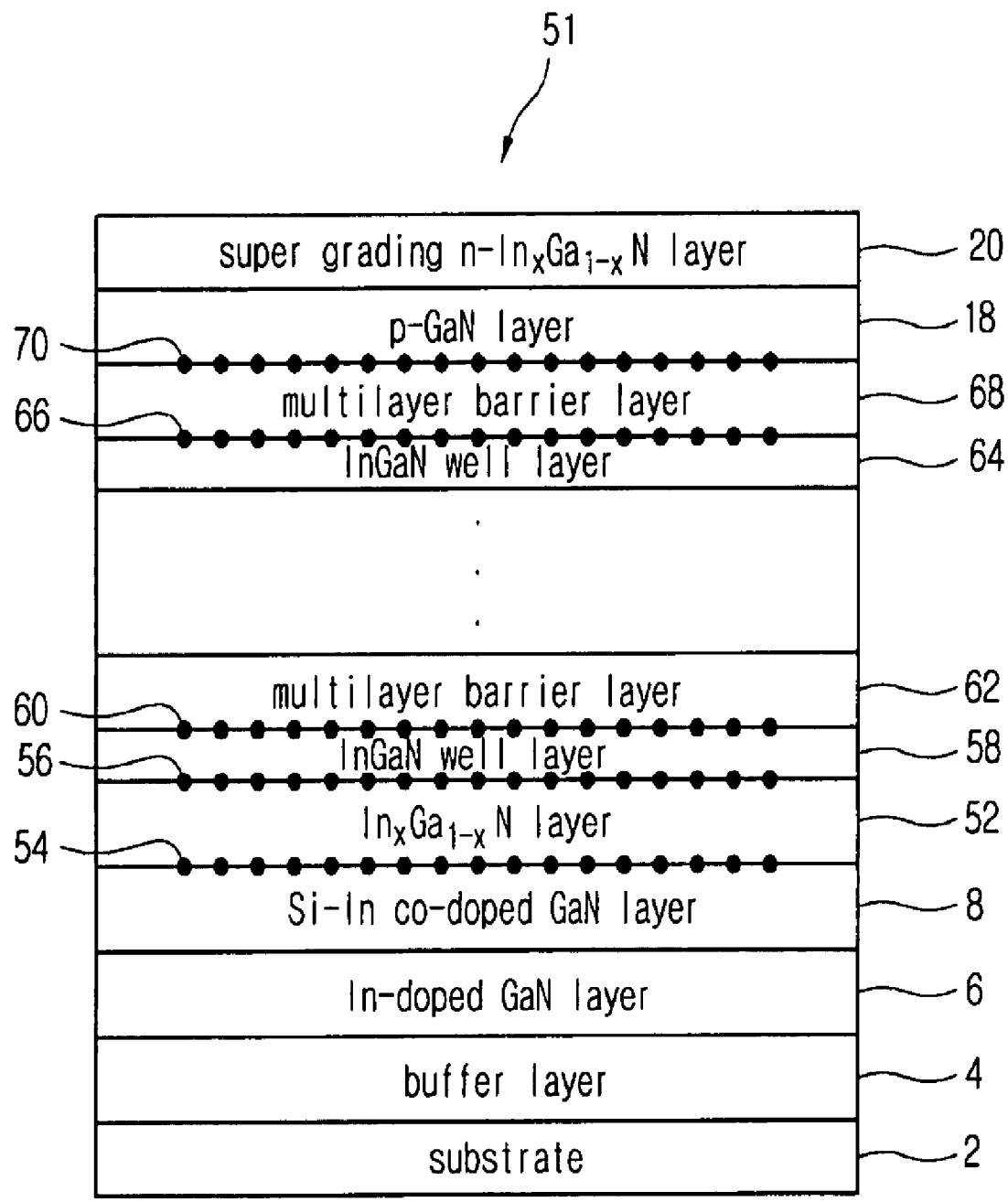
[Fig. 6]

NITRIDE SEMICONDUCTOR LIGHT EMITTING DEVICE AND FABRICATION METHOD THEREOF

TECHNICAL FIELD

The present invention relates to a nitride semiconductor light emitting device and a fabrication method thereof.

BACKGROUND ART

Typically, GaN-based nitride semiconductors are applied in the application fields of optical devices for blue/green LED (Light Emitting Diode) and electronic devices that are high speed switching, high-power devices such as MESFET (Metal Semiconductor Field Effect Transistor), HEMT (High Electron Mobility Transistors), etc.

Such GaN-based nitride semiconductor light emitting devices are mainly grown on a sapphire substrate or a SiC substrate. Then, a polycrystalline thin film of AlyGa1-yN is grown as a buffer layer on the sapphire substrate or the SiC substrate at a low growth temperature. Thereafter, an undoped GaN layer, an n-GaN layer doped with silicon (Si) or a combination of both is grown on the buffer layer at a high temperature to form an n-GaN layer. Further, a p-GaN layer doped with magnesium (Mg) is formed on the top to thus fabricate a nitride semiconductor light emitting device. And, a light emitting layer (active layer of a single quantum well structure or multiple quantum well structure) is formed as a sandwich structure between the n-GaN layer and the p-GaN layer.

The p-GaN layer is formed by doping Mg atoms during crystal growth. The Mg atoms implanted as a doping source during crystal growth should be substituted with Ga positions to act as a p-GaN layer. On the other hand, they are combined with a hydrogen gas separated from the source and a carrier gas to form a Mg—H complex in a GaN crystalline layer and become a high resistance material about 10□.

Therefore, after the formation of a pn junction light emitting device, there is needed a subsequent activation process for substituting Mg atoms with Ga positions by breaking the Mg—H complex. However, the light emitting device has a drawback that the amount of the carrier contributing to light emission in the activation process is approximately $10^{17}/cm^3$, which is much lower than a Mg atomic concentration of $10^{19}/cm^3$, thereby making it difficult to form a resistive contact.

To overcome this, there is utilized a method of lowering a contact resistance by using very thin transparent resistive metals to increase the current injection efficiency. However, the thin transparent resistive metals used to decrease the contact resistance are generally 75 to 80% in light transmission and a light transmission above this value acts as a loss. Further, there are limits in improving light output in a crystal growth of a nitride semiconductor without improving the design of the light emitting device and the crystallinity of a light emission layer and a p-GaN layer in order to increase inner quantum efficiency.

The aforementioned light emission layer is formed in a single quantum well structure or a multiple quantum well structure comprising pairs of well layers and barrier layers. Here, the respective pair of well layers and barrier layers comprising the light emission layer are constructed in a lamination structure of InGaN/GaN or InGaN/InGaN or InGaN/AlGaN or InGaN/AlInGaN.

At this time, materials of the well layer and barrier layer are determined respectively depending on the InGaN well layer, generally, an wavelength band of a light is determined by the indium composition of the InGaN well layer, which is dependent upon a crystal growth temperature, a V/III ratio and a carrier gas. Typically, a light emitting diode formed of a multiple quantum well layer of InGaN/GaN or InGaN/InGaN lamination structures is used, that is to say, a light emitting diode of a multiple quantum well structure utilizing an indium composition and the band engineering concept is used in order to form a light emission layer with a high internal quantum efficiency.

In an embodiment utilizing the band engineering concept, the InGaN/GaN quantum well structure effectively binds the carrier dropped in the InGaN well layer by using a relatively large GaN barrier layer, however, has a drawback that it is hard to obtain the crystallinity of the GaN barrier layer due to a low growth temperature. And, in manufacturing a light emitting diode formed of a multiple quantum well layer of InGaN/GaN lamination structures, there is a drawback that, as the number of periods increases, the number of crystal defects such as pits caused by the crystallinity of the GaN barrier layer is increase, rather than the light efficiency increases in proportion to the number of periods. Finally, there is a drawback that the light emitting layer which contributes light emitting is limited. Moreover in a p-GaN growth, by the formation of pits, Mg dopants are diffused into the pits of the light emission layer, thereby resulting in the breakdown of the interface between a final GaN barrier layer and a p-GaN nitride semiconductor, and affecting the light efficiency and the stability.

Furthermore, the light emission layer of the InGaN/InGaN lamination structure utilizing an indium composition increases the crystal growth temperature while relatively lowering the indium composition of the InGaN barrier layer to less than 5%, thus enabling it to obtain the crystallinity. However, the light emission efficiency is reduced due to a weak binding force of the carrier dropped in the InGaN well layer. Nevertheless, a good reliability can be obtained because crystal defects such as the formation of pits can be relatively suppressed.

Besides, in the event the GaN or InGaN barrier layer is applied to a multiple quantum well structure, although an improvement is expected in terms of leakage current, but this improvement is not resulted from the improvement of its crystallinity, but caused from an increase in operating voltage due to the connection of its resistance components in series. And, these resistance components generate subsequent heat to thus affect the reliability of the device and have a considerable effect on the life of the device.

Consequently, based on this related art, there is needed a new growth technique which guarantees the indium composition of a well layer, the crystallinity of a barrier layer and the concept of band engineering in order to improve the internal quantum efficiency of a light emission layer.

DISCLOSURE OF INVENTION

Technical Problem

It is an object of the present invention to provide a nitride semiconductor light emitting device, which improves the crystallinity of an active layer of the nitride semiconductor light emitting device and improves light output and reliability, and a fabrication method thereof.

Technical Solution

To achieve the above-described object, there is provided a nitride semiconductor light emitting device according to the present invention, comprising: a first nitride semiconductor layer; an active layer of a single or multiple quantum well structure formed on the first nitride semiconductor layer and including an InGaN well layer and a multilayer barrier layer; and a second nitride semiconductor layer formed on the active layer.

Furthermore, to achieve the above-described object, there is provided a fabrication method of a nitride semiconductor light emitting device according to the present invention, the method comprising: forming a buffer layer on a substrate; forming a GaN based layer on the buffer layer; forming a first electrode layer on the GaN based layer; forming an $InxGa1-xN$ layer on the first electrode layer; forming on the first $InxGa1-xN$ layer an active layer including an InGaN well layer and a multilayer barrier layer for emitting light; forming a p-GaN based layer on the active layer; and forming a second electrode layer on the p-GaN based layer.

Furthermore, to achieve the above-described object, there is provided a nitride semiconductor light emitting device according to the present invention, comprising: a substrate; a buffer layer formed on the substrate; a GaN based layer formed on the buffer layer; a Si and/or In doped GaN based layer formed on the GaN based layer; an $InxGa1-xN$ layer formed on the Si and/or In doped GaN based layer; an active layer formed on the $InxGa1-xN$ layer and including a nitride semiconductor well layer containing In and a multilayer barrier layer; a p-type nitride semiconductor layer formed on the active layer; and a second n-type nitride semiconductor layer formed on the p-type nitride semiconductor layer.

Advantageous Effects

The nitride semiconductor light emitting device and the fabrication method thereof according to the present invention can improves the crystallinity of an active layer of the nitride semiconductor light emitting device and improves light output and reliability.

BRIEF DESCRIPTION OF THE DRAWINGS

FIG. 1 is a view schematically showing a lamination structure of a first embodiment of a nitride semiconductor light emitting device according to the present invention.

FIG. 2 is a view showing an example of a lamination structure of an active layer formed on the nitride semiconductor light emitting device according to the present invention.

FIG. 3 is a view schematically showing a lamination structure of a second embodiment of a nitride semiconductor light emitting device according to the present invention.

FIG. 4 is a view schematically showing a lamination structure of a third embodiment of a nitride semiconductor light emitting device according to the present invention.

FIG. 5 is a view schematically showing a lamination structure of a fourth embodiment of a nitride semiconductor light emitting device according to the present invention.

FIG. 6 is a view schematically showing a lamination structure of a fifth embodiment of a nitride semiconductor light emitting device according to the present invention.

MODE FOR THE INVENTION

Hereinafter, embodiments of the present invention will be described in detail with reference to the accompanying drawings.

FIG. 1 is a view schematically showing a lamination structure of a first embodiment of a nitride semiconductor light emitting device according to the present invention.

In the nitride semiconductor light emitting device 1 of the invention, as shown in FIG. 1, a buffer layer 4 is formed on a substrate 2. Here, the buffer layer 4 may be formed in a structure selected from the group including of an AlInN/GaN lamination structure, an InGaN/GaN superlattice structure, an $InxGa1-xN/GaN$ lamination structure and an $AlxInyGa1-(x+y)N/InxGa1-xN/GaN$ lamination structure (Here, $0 \leq x \leq 1$, $0 \leq y \leq 1$, $x+y \leq 1$).

An In-doped GaN layer 6 is formed on the buffer layer 4, and an n-type first electrode layer is formed on the In-doped GaN layer 6. Here, as the n-type first electrode layer, a Si—In co-doped GaN layer 8 formed by co-doping with both silicon and indium may be employed.

Further, an $InxGa1-xN$ layer 10 with a low indium content is formed on the Si—In co-doped GaN layer 8, and an active layer 16 emitting light is formed on the $InxGa1-xN$ layer 10.

The nitride semiconductor light emitting device 1 of this invention is characterized in that the active layer 16 comprises an InGaN well layer 12 and a multilayer barrier layer 14. Although FIG. 1 illustrates the active layer 16 formed in a single quantum well structure, the active layer 16 may be formed in a multiple quantum well structure. Also, the active layer 16 of this invention is advantageous in that a sufficient light efficiency can be attained even in a case where it is formed in a single quantum well structure.

FIG. 2 is a view showing an example of a lamination structure of an active layer formed on the nitride semiconductor light emitting device according to the present invention.

The active layer 16 of this invention, as shown in FIG. 2, comprises an InGaN well layer 12 and a multilayer barrier layer 14. The multilayer barrier layer 14 may be formed of a plurality of layers including an InGaN barrier layer 13, an AlInN barrier layer 15 and a (InGaN/GaN superlattice) barrier layer 17.

By forming such a multilayer barrier layer 14, the formation of pits on the barrier layer can be prevented. The InGaN barrier layer 13 suppresses the formation of pits, and the AlInN barrier layer 15 forms a good interface with the InGaN barrier layer 13. The (InGaN/GaN superlattice) barrier layer 17 serves to control the indium composition and surface state of the InGaN well layer formed on the top of the multilayer barrier layer when a multiple quantum well structure is used. Additionally, the (InGaN/GaN superlattice) barrier layer 17 suppresses the formation of pits once again, and effectively prevents Mg dopants from diffused into the formation of pits, thereby forming a good interface with a p-GaN nitride semiconductor, and thus increasing the internal quantum efficiency.

By the active layer 16 of single quantum well structure having such a lamination structure, a clean interface structure between the (InGaN/GaN superlattice) barrier layer 17 and the p-GaN nitride semiconductor can be formed in the growth of the p-GaN nitride semiconductor. Further, as the diffusion of Mg dopants into the active layer is effectively prevented, a nitride semiconductor light emitting device having a light output greater than 5 mW can be accomplished even in a case where the active layer is formed in a single quantum well structure.

In a case where an active layer of a multiple quantum well structure in which such a lamination structure is repeated, the growth of an InGaN well layer formed on the top of an (InGaN/GaN superlattice) barrier layer can be controlled by control of the surface shape of the (InGaN/GaN superlattice) barrier layer. By such growth control, the growth condition for increasing internal quantum efficiency can be found.

Besides, though not shown, the active layer 16 may be formed in a single quantum well structure or multiple quantum well structure comprising an InGaN well layer and a multilayer barrier layer of InGaN barrier layer/AlInN barrier layer/InGaN barrier layer.

Besides, though not shown, the active layer 16 may be formed in a single quantum well structure or multiple quantum well structure comprising an InGaN well layer and a multilayer barrier layer of InGaN barrier layer/AlInN barrier layer/GaN barrier layer.

Besides, though not shown, the active layer 16 may be formed in a single quantum well structure or multiple quantum well structure comprising an InGaN well layer and a multilayer barrier layer of InGaN barrier layer/AlInN barrier layer.

Continually, a p-GaN layer 18 is formed on the active layer 16. At this point, the p-GaN layer 18 may be doped with magnesium.

An n-type second electrode layer is formed on the p-GaN layer 18. Here, as the n-type second electrode layer, can be employed a super grading n-$In_xGa_{1-x}N$ layer 20 which controls the energy band gap by sequentially changing the indium composition. At this point, the super grading n-$In_xGa_{1-x}N$ layer 20 can be formed in a composition range of $0<x<0.2$.

The above-described nitride semiconductor light emitting device of the invention can be analyzed as having a npn junction light emitting device structure, unlike a related art pn junction light emitting device, considering that both first electrode layer 8 and second electrode layer 20 are formed of n-type nitride, and a p-GaN layer 18 is formed therebetween.

The n-type nitride semiconductor (e.g., the super grading n-$In_xGa_{1-x}N$ layer 20) used as the second electrode layer is able to maximize current injection by reducing the contact resistance since it has a lower resistance than existing p-GaN contact layers. As a transparent electrode for applying a bias voltage to the second electrode layer, can be used a transparent resistive material or transparent conductive oxide layer which maximizes current diffusion in order to maximize light output and has an excellent light transmittance. ITO, ZnO, RuOx, IrOx, NiO, or Au alloy metal including Ni may be used as such a material.

In the present invention, in a single quantum well structure using, as a transparent electrode, Ni/Au, which is a general transparent resistive conductive metal, light output (375 µm×330 µm) of 5 mW/3.0V (20 mA) is obtained at a 460 nm wavelength. While, in a single quantum well structure using, as a transparent electrode, ITO, which is a transparent conductive oxide material, light output of 6.2 mW/3.0V (20 mA) is obtained at the same 460 nm wavelength.

FIG. 3 is a view schematically showing a lamination structure of a second embodiment of a nitride semiconductor light emitting device according to the present invention.

In the lamination structure of the nitride semiconductor light emitting device 21 as shown in FIG. 3, only a second electrode layer is different from that of the nitride semiconductor light emitting device 1 as shown in FIG. 1, so the following description will be made only with respect to the second electrode layer. That is, the nitride semiconductor light emitting device 21 according to the second embodiment of the present invention represents the case in which an InGaN/AlInGaN superlattice structure layer 26 is formed as the second electrode. Here, the InGaN/AlInGaN superlattice structure layer 26 may be doped with silicon.

Besides, though not shown, an InGaN/InGaN superlattice structure layer may be formed as the second electrode layer, and may be doped with silicon.

FIG. 4 is a view schematically showing a lamination structure of a third embodiment of a nitride semiconductor light emitting device according to the present invention.

In the lamination structure of the nitride semiconductor light emitting device 31 as shown in FIG. 4, only the lamination structure of an active layer 36 is different from that of the nitride semiconductor light emitting device 1 as shown in FIG. 1, so the following description will be made only with respect to the active layer 36. That is, in the nitride semiconductor light emitting device 31 according to the third embodiment of the present invention, the active layer 36 comprises an InGaN well layer 12, a GaN cap layer 32 and a multilayer barrier layer 14. This is for controlling indium fluctuations in the InGaN well layer 12 by forming the GaN cap layer 32 between the InGaN well layer 12 and multilayer barrier layer 14 of the active layer 36.

FIG. 5 is a view schematically showing a lamination structure of a fourth embodiment of a nitride semiconductor light emitting device according to the present invention, which illustrates the case in which an active layer 50 is formed in a multiple quantum well structure. In the nitride semiconductor light emitting device 41 according to the fourth embodiment of the present invention, as shown in FIG. 5, the active layer 50 is formed in a multiple quantum well structure. That is, an InGaN well layer 42, a multilayer barrier layer 44, . . . , an InGaN well layer 46 and a multilayer barrier layer 48 are laminated to form the active layer 50 of multiple quantum well structure.

FIG. 6 is a view schematically showing a lamination structure of a fifth embodiment of a nitride semiconductor light emitting device according to the present invention. Among the lamination structure as shown in FIG. 6, a description of the layers (given the same reference numeral) described with reference to FIG. 1 will be omitted.

In the nitride semiconductor light emitting device 51 according to the fifth embodiment of the present invention, as shown in FIG. 6, a low-mole $In_xGa_{1-x}N$ layer 52 with a low indium content for controlling the strain of an active layer is formed in order to increase the internal quantum efficiency. Moreover, SiNx cluster layers 54 and 56 grown by being controlled in atomic scale are further provided on the bottom and top parts of the low-mole $In_xGa_{1-x}N$ layer 52 in order to improve light output caused by indium fluctuations and reverse leakage current.

Besides, an active layer emitting light may be formed in a single quantum well structure or multiple quantum well structure which is formed of an InGaN well structure and a multilayer barrier layer.

FIG. 6 illustrates an example of the light emitting device formed in a multiple quantum well structure which further includes SiNx cluster layers 60 and 66 as active layers between InGaN well layers 58 and 64 and multilayer barrier layers 62 and 68. Considering the relation with the low-mole $In_xGa_{1-x}N$ layer 52 with a low indium content, the content(x) of indium doped on the low-mole $In_xGa_{1-x}N$ layer 52 and the content(y) of indium doped on the InGaN well layers 58 and 64 can be adjusted to have a value of $0<x<0.1$ and $0<y<0.35$, respectively.

Then, the final layer of the active layer formed in a single quantum well structure or multiple quantum well structure is grown, and thereafter a SiNx cluster layer 70 is grown again with an atomic scale thickness, thus suppressing Mg atoms of a p-GaN layer 18 from diffused into the active layer.

Although FIG. 6 illustrates the case in which a super grading n-$In_xGa_{1-x}N$ layer 20 is formed as a second electrode layer, an InGaN/AlInGaN superlattice structure layer or an InGaN/InGaN superlattice structure layer also may be formed as the second electrode layer.

As described above, according to the nitride semiconductor light emitting device of the present invention, current concentration caused from a high contact resistance of a p-GaN layer used as a p-type electrode layer in a related art p/n junction light emitting device can be reduced by applying an n/p/n junction light emitting device structure while reducing an operating voltage and improving current injection.

INDUSTRIAL APPLICABILITY

According to the nitride semiconductor light emitting device and fabrication method thereof of the present invention, the crystallinity of an active layer of the nitride semiconductor light emitting device can be improved and light output and reliability can be improved.

The invention claimed is:

1. A nitride semiconductor light emitting device, comprising:
    a first nitride semiconductor layer;
    an $In_xGa_{1-x}N$ layer on the first nitride semiconductor layer;
    an active layer of a single or multiple quantum well structure on the $In_xGa_{1-x}N$ layer and including an $In_yGa_{1-y}N$ well layer and a multilayer barrier layer; and
    a second nitride semiconductor layer on the active layer, wherein the is doped with indium lower in content than the indium doped on the $In_yGa_{1-y}N$ well layer in which y satisfies a relation of $0<y<0.35$.

2. The nitride semiconductor light emitting device of claim 1, wherein the first nitride semiconductor layer comprises:
    an undoped or In-doped GaN based layer; and
    a first electrode layer formed on the GaN based layer.

3. The nitride semiconductor light emitting device of claim 2, further comprising a second electrode layer formed on the second nitride semiconductor layer.

4. The nitride semiconductor light emitting device of claim 2, wherein the first electrode layer is a GaN based layer co-doped with silicon and indium.

5. The nitride semiconductor light emitting device of claim 3, wherein the second electrode layer is formed in a superlattice structure including In.

6. The nitride semiconductor light emitting device of claim 3, wherein the second electrode layer is doped with silicon.

7. The nitride semiconductor light emitting device of claim 3, wherein the first electrode layer included in the first nitride semiconductor and the second electrode layer are n-type nitride semiconductors.

8. The nitride semiconductor light emitting device of claim 3, further comprising a transparent electrode provided on the second electrode layer.

9. The nitride semiconductor light emitting device of claim 8, wherein the transparent electrode is formed of transparent conductive oxide or transparent resistive material.

10. The nitride semiconductor light emitting device of claim 8, wherein the transparent electrode is selected from the group including ITO, ZnO, RuOx, IrOx, NiO, or Au alloy metal including Ni.

11. The nitride semiconductor light emitting device of claim 1, further comprising:
    a substrate under the first nitride semiconductor; and
    a buffer layer formed on the substrate.

12. The nitride semiconductor light emitting device of claim 11, wherein the buffer layer is formed in a structure selected from the group including an AlInN/GaN lamination structure, an InGaN/GaN superlattice structure, an $In_xGa_{1-x}N/GaN$ lamination structure and an $Al_xIn_yGa_{1-(x+y)}N/In_xGa_{1-x}N/GaN$ lamination structure.

13. The nitride semiconductor light emitting device of claim 1, wherein the second nitride semiconductor layer is formed by doping with p-type impurities.

14. The nitride semiconductor light emitting device of claim 1, wherein the multilayer barrier layer of the active layer is formed of a multilayer barrier layer including an InGaN layer, an AlInN layer and an InGaN/GaN superlattice structure layer or a multilayer barrier layer including an InGaN layer, an AlInN layer and an InGaN layer or a multilayer barrier layer including an InGaN layer, an AlInN layer and a GaN layer or a multilayer barrier layer including an InGaN layer and AlInN layer.

15. The nitride semiconductor light emitting device of claim 1, wherein x in the $In_xGa_{1-x}N$ layer satisfies a relation of $0<x<0.1$.

16. A fabrication method of a nitride semiconductor light emitting device, the method comprising:
    forming a first electrode layer;
    forming an $In_xGa_{1-x}N$ layer on the first electrode layer;
    forming an active layer of a single or multiple quantum well structure including an $In_yGa_{1-y}N$ well layer and a multilayer barrier layer for emitting light on the $In_xGa_{1-x}N$ layer;
    forming a p-GaN based layer on the active layer; and
    forming a second electrode layer on the p-GaN based layer,
    wherein the $In_xGa_{1-x}N$ layer is doped with indium lower in content than the indium doped on the $In_yGa_{1-y}N$ well layer in which y satisfies a relation of $0<y<0.35$.

17. The method of claim 16, wherein the first electrode layer is a GaN based layer co-doped with silicon and indium.

18. The method of claim 16, wherein the second electrode layer is formed in an InGaN/InGaN superlattice structure or in an InGaN/AlInGaN superlattice structure.

19. The method of claim 18, wherein the second electrode layer is doped with silicon.

20. The method of claim 16, further comprising forming a transparent electrode on the second layer.

21. The method of claim 16, wherein the multilayer barrier layer of the active layer is formed of a multilayer barrier layer including an InGaN layer, an AlInN layer and an InGaN/GaN superlattice structure layer or a multilayer barrier layer including an InGaN layer, an AlInN layer and an InGaN layer or a multilayer barrier layer including an InGaN layer, an AlInN layer and a GaN layer or a multilayer barrier layer including an InGaN layer and AlInN layer.

22. The method of claim 16, wherein x in the $In_xGa_{1-x}N$ layer satisfies a relation of $0<x<0.1$.

23. A nitride semiconductor light emitting device, comprising:
    a first n-type nitride semiconductor layer;
    an $In_xGa_{1-x}N$ layer on the first n-type nitride semiconductor layer;
    an active layer of a single or multiple quantum well structure on the $In_xGa_{1-x}N$ layer and including an $In_yGa_{1-y}N$ well layer and a multilayer barrier layer;
    a p-type nitride semiconductor layer on the active layer; and
    a second n-type nitride semiconductor layer on the p-type nitride semiconductor layer,
    wherein the $In_xGa_{1-x}N$ layer is doped with indium lower in content than the indium doped on the $In_yGa_{1-y}N$ well layer in which y satisfies a relation of $0<y<0.35$.

24. The nitride semiconductor light emitting device of claim 23, further comprising:
    a substrate; and
    a buffer layer formed on the substrate,
    wherein the buffer layer is formed in a structure selected from the group including an AlInN/GaN lamination structure, an InGaN/GaN superlattice structure, an $In_xGa_{1-x}N$/GaN lamination structure and an $Al_xIn_yGa_{1-(x+y)}N$/$In_xGa_{1-x}N$/GaN lamination structure.

25. The nitride semiconductor light emitting device of claim 23, wherein the second n-type nitride semiconductor layer is formed in an InGaN/InGaN superlattice structure or in an InGaN/AlInGaN superlattice structure.

26. The nitride semiconductor light emitting device of claim 23, wherein the multilayer barrier layer of the active layer is formed of a multilayer barrier layer including an InGaN layer, an AlInN layer and an InGaN/GaN superlattice structure layer or a multilayer barrier layer including an InGaN layer, an AlInN layer and an InGaN layer or a multilayer barrier layer including an InGaN layer, an AlInN layer and a GaN layer or a multilayer barrier layer including an InGaN layer and AlInN layer.

27. The nitride semiconductor light emitting device of claim 23, wherein x in the $In_xGa_{1-x}N$ layer satisfies a relation of $0<x<0.1$.

* * * * *